US009674947B2

(12) United States Patent
Shim et al.

(10) Patent No.: US 9,674,947 B2
(45) Date of Patent: Jun. 6, 2017

(54) TRANSPARENT CONDUCTOR, METHOD FOR PREPARING THE SAME, AND OPTICAL DISPLAY INCLUDING THE SAME

(71) Applicant: SAMSUNG SDI CO., LTD., Yongin-si, Gyeonggi-do (KR)

(72) Inventors: Dae Seob Shim, Suwon-si (KR); Young Kwon Koo, Suwon-si (KR); Dong Myeong Shin, Suwon-si (KR); Do Sang Lee, Suwon-si (KR); Oh Hyeon Hwang, Suwon-si (KR); Kyoung Ku Kang, Suwon-si (KR)

(73) Assignee: SAMSUNG SDI CO., LTD., Yongin-Si, Gyeonggi-Do (KR)

( * ) Notice: Subject to any disclaimer, the term of this patent is extended or adjusted under 35 U.S.C. 154(b) by 163 days.

(21) Appl. No.: 14/559,474

(22) Filed: Dec. 3, 2014

(65) Prior Publication Data
US 2015/0156866 A1    Jun. 4, 2015

(30) Foreign Application Priority Data
Dec. 4, 2013    (KR) .................. 10-2013-0150230

(51) Int. Cl.
*H05K 1/02*    (2006.01)
*H05K 1/09*    (2006.01)

(52) U.S. Cl.
CPC ........... *H05K 1/0274* (2013.01); *H05K 1/097* (2013.01); *H05K 2201/0108* (2013.01); *H05K 2201/026* (2013.01); *H05K 2201/0254* (2013.01)

(58) Field of Classification Search
CPC ............... H05K 1/0274; H05K 1/097; H05K 2201/026; H05K 2201/0254; H05K 2201/108; H01B 5/14
See application file for complete search history.

(56) References Cited

U.S. PATENT DOCUMENTS

| 5,958,514 | A | * | 9/1999 | Havey | ............... | C08G 59/3254 |
| | | | | | | 427/386 |
| 6,589,658 | B1 | * | 7/2003 | Stachowiak | ............ | C03C 17/36 |
| | | | | | | 428/426 |
| 8,018,568 | B2 | * | 9/2011 | Allemand | .............. | B82Y 10/00 |
| | | | | | | 349/187 |
| 8,049,333 | B2 | * | 11/2011 | Alden | ................... | B82Y 20/00 |
| | | | | | | 257/741 |
| 9,384,865 | B2 | * | 7/2016 | Kim | ...................... | H01B 1/124 |
| 2008/0259262 | A1 | * | 10/2008 | Jones | .................... | B82Y 10/00 |
| | | | | | | 349/139 |

(Continued)

FOREIGN PATENT DOCUMENTS

| CN | 101971354 A | 2/2011 |
| CN | 102324462 A | 1/2012 |

(Continued)

*Primary Examiner* — Nathan Milakovich
(74) *Attorney, Agent, or Firm* — Lee & Morse, P.C.

(57) ABSTRACT

A transparent conductor, a method of fabricating the same, and an optical display, the transparent conductor including a base layer; and a conductive layer on the base layer, the conductive layer including metal nanowires and a matrix, wherein the matrix is prepared from a matrix composition, the matrix composition including inorganic hollow particles, a fluorine-containing monomer, or a mixture thereof.

20 Claims, 4 Drawing Sheets

(56) References Cited

U.S. PATENT DOCUMENTS

| | | | | |
|---|---|---|---|---|
| 2011/0088770 A1* | 4/2011 | Allemand | | B82Y 10/00 136/256 |
| 2011/0174190 A1* | 7/2011 | Sepa | | H01B 1/22 106/31.92 |
| 2012/0305061 A1* | 12/2012 | O'Brien et al. | | C03C 17/006 136/255 |
| 2013/0078440 A1* | 3/2013 | Kim | | C09D 7/005 428/212 |
| 2013/0213703 A1* | 8/2013 | Kawaguchi | | C23C 14/0042 174/257 |
| 2013/0258570 A1* | 10/2013 | Nashiki | | G06F 3/044 361/679.01 |
| 2014/0186587 A1* | 7/2014 | Shin | | H05K 1/09 428/172 |
| 2014/0302326 A1* | 10/2014 | Shin | | G02B 1/10 428/412 |
| 2014/0305682 A1* | 10/2014 | Sato | | C08K 3/00 174/253 |
| 2015/0111048 A1* | 4/2015 | Kim | | H01B 1/22 428/457 |
| 2015/0118508 A1* | 4/2015 | Shin | | H01B 1/22 428/457 |
| 2015/0255183 A1* | 9/2015 | Kim | | H01B 1/02 428/312.6 |
| 2016/0128187 A1* | 5/2016 | Liou | | H05K 3/207 174/253 |
| 2017/0003808 A1* | 1/2017 | Kim | | G06F 3/0416 |

FOREIGN PATENT DOCUMENTS

| | | |
|---|---|---|
| CN | 102763171 A | 10/2012 |
| CN | 102985499 A | 3/2013 |
| CN | 103201105 A | 7/2013 |
| JP | 2001167637 A * | 6/2001 |
| JP | 2011-0029098 A | 2/2011 |
| KR | 10-2012-0053724 A | 5/2012 |
| WO | WO 2009-107694 A1 | 9/2009 |

* cited by examiner

TRANSPARENT CONDUCTOR, METHOD FOR PREPARING THE SAME, AND OPTICAL DISPLAY INCLUDING THE SAME

CROSS-REFERENCE TO RELATED APPLICATION

Korean Patent Application No. 10-2013-0150230, filed on Dec. 4, 2013, in the Korean Intellectual Property Office, and entitled: "Transparent Conductor, Method for Preparing the Same and Optical Display Comprising the Same," is incorporated by reference herein in its entirety.

BACKGROUND

1. Field

Embodiments relate to a transparent conductor, a method for preparing the same, and an optical display including the same.

2. Description of the Related Art

Transparent conductors may be used in various fields such as touchscreen panels included in displays, flexible displays, or the like. Transparent conductors may exhibit good properties such as transparency, sheet resistance, or the like, and may also exhibit flexural properties as an application range thereof expands to flexible displays in recent years.

SUMMARY

Embodiments are directed to a transparent conductor, a method for preparing the same, and an optical display including the same.

The embodiments may be realized by providing a transparent conductor including a base layer; and a conductive layer on the base layer, the conductive layer including metal nanowires and a matrix, wherein the matrix is prepared from a matrix composition, the matrix composition including inorganic hollow particles, a fluorine-containing monomer, or a mixture thereof.

The transparent conductor may have a transmissive b* value of about 1.0 or less.

The matrix composition may include the inorganic hollow particles, and the inorganic hollow particles may have a refractive index of about 1.4 or less.

The inorganic hollow particles may be included in the matrix composition in an amount of about 10 wt % to about 70 wt %, in terms of solid content.

The matrix composition may include the inorganic hollow particles, and the inorganic hollow particles may include an oxide, a carbide, or a nitride of at least one of silicon, aluminum, magnesium, lithium, zirconium, or zinc.

The matrix composition may include the fluorine-containing monomer, and the matrix composition may include about 6 wt % or less of fluorine atoms, in terms of solid content.

The matrix composition may include about 40 wt % to about 80 wt % of the inorganic hollow particles, the fluorine-containing monomer, or the mixture thereof; about 15 wt % to about 55 wt % of a binder; and about 0.1 wt % to about 5 wt % of an initiator, all wt % being in terms of solid content.

The metal nanowires may include silver nanowires.

The transparent conductor may further include at least one of an anticorrosive layer on an upper surface or a lower surface of the base layer, an antiglare coating layer on an upper surface or a lower surface of the base layer, an adhesion promoting layer on an upper surface or a lower surface of the base layer, or an oligomer elution prevention layer on an upper surface or a lower surface of the base layer.

The matrix composition may further include a tri-functional monomer, and a polyfunctional monomer, the polyfunctional monomer including a penta-functional monomer or a hexa-functional monomer.

The tri-functional monomer may include a (meth)acrylate-based monomer.

The tri-functional monomer may include an alkoxylated (meth)acrylate-based monomer.

The matrix composition may further include at least one of an adhesion promoter, a UV absorber, a thickening agent, and a dispersant.

A weight ratio of the penta-functional monomer or hexa-functional monomer to the tri-functional monomer may be 1:1 to 5:1.

The embodiments may be realized by providing a method of fabricating a transparent conductor, the method including forming a metal nanowire network layer on a base layer; and forming a conductive layer on the metal nanowire network layer using a matrix composition, the matrix composition including inorganic hollow particles, a fluorine-containing monomer, or a mixture thereof.

The matrix composition may further include a tri-functional monomer, and a polyfunctional monomer, the polyfunctional monomer including a penta-functional monomer or a hexa-functional monomer.

The embodiments may be realized by providing an optical display including the transparent conductor according to an embodiment.

The embodiments may be realized by providing an optical display including a display panel; a transparent conductor on the display panel; and a window on the transparent conductor, wherein the transparent conductor includes the transparent conductor according to an embodiment.

The display panel may include a liquid crystal display panel, an organic light emitting diode display panel, or a light emitting diode display panel.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
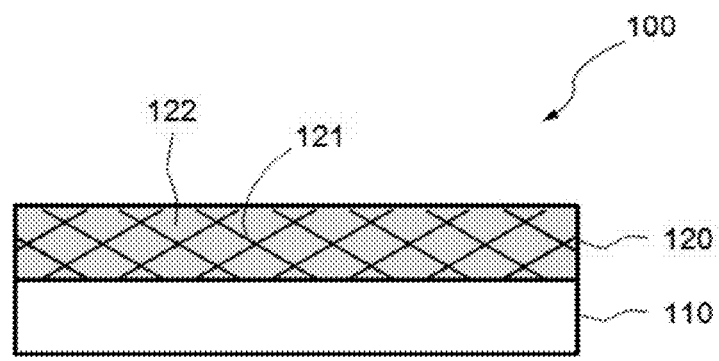
FIG. 1 illustrates a sectional view of a transparent conductor according to an embodiment.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, directional terms such as "upper side (surface)" and "lower side (surface)" are defined with reference to the accompanying drawings. Thus, it will be understood that "upper side (surface)" may be used interchangeably with "lower side (surface)". The term "(meth) acrylate" may refer to acrylates and/or methacrylates.

Embodiments may provide a transparent conductor, which may include, e.g., a base layer and a transparent conductive layer on a surface, e.g., on an upper surface, of the base layer. The transparent conductive layer may include, e.g., metal nanowires and a matrix. The matrix may be formed of or prepared from a composition including, e.g., inorganic hollow particles, a fluorine-containing monomer, or a mixture thereof. The transparent conductor or transparent conductive layer may help increase an overall transmittance, while reducing haze, by allowing light reflected from the matrix to be offset by light reflected from the transparent conductive layer, thereby enhancing optical properties.

The matrix may be formed of or prepared from the matrix composition that includes the inorganic hollow particles, the fluorine-containing monomer, or the mixture thereof. The inorganic hollow particles, the fluorine-containing monomer, or the mixture thereof may have a low refractive index and thus may help reduce the refractive index of the matrix. As a result, color difference of the transparent conductive layer may be corrected, thereby preventing color distortion through reduction in transmissive b* value of the transparent conductor. In this case, upon formation of a transparent electrode film by patterning the transparent conductor, there may be an effect of improving pattern visibility between a patterned portion and a non-patterned portion. Further, the inorganic hollow particles may help increase surface hardness of the transparent conductive layer, thereby improving handling properties of the transparent conductor.

The transparent conductor may help prevent color distortion by reducing the transmissive b* value. In an implementation, the transparent conductor may have a transmissive b* value of about 1.0 or less, e.g., about 0.85 or less, about 0.1 to about 0.85, or 0.4 to 0.85. Within this range of the transmissive b* value, the transparent conductor may help prevent color distortion.

As used herein, the "transmissive b* value" may be measured on a transparent conductor, which includes a polycarbonate base film and a conductive layer stacked on the base film (the conductive layer including metal nanowires and a matrix), by using a CM 3600D spectrophotometer (Konica Minolta Co., Ltd.) at a visible light wavelength of 400 nm to 700 nm. Here, it should be understood that transmissive b* values may also be measured when the material and thickness of the base film, the thickness of the conductive layer, and/or the measurement wavelength are changed.

Next, a transparent conductor 100 according to an embodiment will be described with reference to FIG. 1. FIG. 1 illustrates a sectional view of a transparent conductor according to an embodiment. Referring to FIG. 1, the transparent conductor 100 may include a base layer 110; and a transparent conductive layer 120 on one surface of the base layer 110. The transparent conductive layer 120 may include metal nanowires 121 and a matrix 122. The matrix may include inorganic hollow particles, a fluorine-containing monomer, or a mixture thereof to help reduce a refractive index thereof while correcting a color difference of the transparent conductive layer. For example, the matrix may be prepared from a matrix composition that includes, e.g., inorganic hollow particles, a fluorine-containing monomer, or a mixture thereof. Thus, color distortion of the transparent conductor may be prevented by reducing the transmissive b* value of the transparent conductor. As a result, the transparent conductor may exhibit improved optical properties, e.g., transmittance, haze, and the like.

The base layer 110 may be a transparent film and may have a transmittance of about 85% to about 100%, e.g., about 88% to 99%, at a wavelength of 550 nm. In an implementation, the base layer may have a refractive index of about 1.5 to about 1.65. Within this range, the transparent conductor 100 may exhibit improved optical properties.

The base layer 110 may be a flexible insulation film. For example, the base layer 110 may include, e.g., a polyester resin such as polyethylene terephthalate (PET), polyethylene naphthalate, or the like; a polycarbonate; a cyclic olefin polymer; a polyolefin resin; a polysulfone resin, a polyimide resin, a silicone resin, a polystyrene resin, a polyacryl resin, a polyvinylchloride resin, or mixtures thereof. In an implementation, the base layer 110 may be composed of a single layer or a stack structure of at least two resin films bonded to each other, e.g., via adhesives.

The base layer 110 may have a thickness of about 10 μm to about 200 μm, e.g., about 30 μm to about 150 μm, 40 μm to about 125 μm, or 50 μm to about 125 μm. Within this range, the base layer may be advantageously used for displays, e.g., flexible displays.

The transparent conductive layer 120 may be formed on, e.g., an upper surface of the base layer 110.

The transparent conductive layer 120 may include the metal nanowires 121 and the matrix 122. The transparent conductive layer 120 may include a conductive network composed of the metal nanowires 121, thereby securing conductivity, good flexibility, and bendability. Such a transparent conductive layer may form electrodes through a patterning process such as etching or the like, and may be used in a flexible device in order to secure flexibility. In an implementation, the electrodes may be formed in a plurality of lines in a first direction and a second direction.

The metal nanowires 121 may exhibit better dispersibility than metal nanoparticles, e.g., due to the shape of the nanowires. In an implementation, the metal nanowires 121 may help significantly reduce sheet resistance of the transparent conductive film, e.g., due to a difference between the particle shape and the nanowire shape. The metal nanowires 121 may have an ultrafine wire shape having a specific cross-section.

In an implementation, a ratio of a length (L) to a cross-sectional diameter (d) of the metal nanowires 121 (L/d, aspect ratio) may be about 10 to about 2,000. In an implementation, the metal nanowires may have an aspect ratio of about 500 to about 1,000, e.g., about 500 to about 700. Within this range, the transparent conductor may help realize a highly conductive network even at a low density of nanowires, and may exhibit reduced sheet resistance. The metal nanowires may have a cross-sectional diameter (d) of about 100 nm or less. In an implementation, the metal nanowires may have a cross-sectional diameter (d) of about 30 nm to about 100 nm, or about 60 nm to about 100 nm. Within this range, a transparent conductor 100 exhibiting high conductivity and low sheet resistance may be realized by securing a high L/d. The metal nanowires may have a length (L) of about 20 µm or more. In an implementation, the metal nanowires may have a length (L) of about 20 µm to about 50 µm. Within this range, a conductive film exhibiting high conductivity and low sheet resistance may be realized by securing a high L/d. The metal nanowires 121 may include nanowires formed of a suitable metal. In an implementation, the metal nanowires may include, e.g., silver nanowires, copper nanowires, gold nanowires, or mixtures thereof. In an implementation, the metal nanowires may include the silver nanowires or may include mixtures including the silver nanowires.

The metal nanowires 121 may be prepared by a suitable method or may be commercially available. For example, the metal nanowires may be prepared through reduction of a metal salt (e.g., silver nitrate, $AgNO_3$) in the presence of a polyol and poly(vinyl pyrrolidone). Alternatively, a commercially available product manufactured by, e.g., Cambrios Co., Ltd. (for example, ClearOhm Ink, a metal nanowire-containing solution) may be used.

The metal nanowires 121 may be present in the transparent conductive layer 120 in an amount of about 40 wt % or more, e.g., about 40 wt % to about 80 wt % or about 50 wt % to about 80 wt %. Within this range, the metal nanowires may help form the conductive network to secure sufficient conductivity and may exhibit adhesion to the base layer.

The metal nanowires 121 may be impregnated into the matrix 122. For example, the metal nanowires may be dispersed or embedded in the matrix 122. The matrix 122 may help prevent oxidation and abrasion of the metal nanowires 121, which may be exposed at an upper or outer side of the transparent conductive layer 120. Such a matrix 122 may impart adhesion between the transparent conductive layer 120 and the base layer 110, and may help improve optical properties, chemical resistance, and solvent resistance of the transparent conductor. In an implementation, some metal nanowires 121 may be exposed and protrude from the surface of the matrix 122.

The matrix 122 may be formed of or prepared from the matrix composition including the inorganic hollow particles, the fluorine-containing monomer, or the mixture thereof. The matrix composition may be used in a state of being dispersed in liquid in order to help secure easy coating onto the base layer 110 and adhesion thereto.

A total amount of the inorganic hollow particles, the fluorine-containing monomer, or the mixture thereof, may be about 100 wt % or less, e.g., about 10 wt % to about 90 wt %, about 40 wt % to about 80 wt %, or about 50 wt % to about 80 wt %, based on solid content of the matrix composition.

The inorganic hollow particles, the fluorine-containing monomer, or the mixture thereof may have a low refractive index and thus may help reduce the refractive index of the matrix 122. As a result, the transmissive b* value of the transparent conductor may be reduced by correcting the color difference of the transparent conductive layer, thereby helping to reduce and/or prevent color distortion of the transparent conductor.

The inorganic hollow particles may have a hollow structure and may have a low refractive index. In an implementation, the inorganic hollow particles may have a refractive index of about 1.4 or less, e.g., about 1.33 to about 1.38. Within this range, the transparent conductor may exhibit low transmissive b* and high transmittance. The inorganic hollow particles may have an average particle size of about 30 nm to 100 nm, e.g., about 40 nm to about 70 nm. Within this range, the inorganic hollow particles may be included in the matrix and may be advantageously applied to the transparent conductive layer. In an implementation, the inorganic hollow particles may help improve durability of the transparent conductive layer and optical properties by further reducing the transmissive b* value, as compared with organic particles formed of an organic material.

The inorganic hollow particles may be formed of or may include, e.g., oxides, carbides, or nitrides of silicon, aluminum, magnesium, lithium, zirconium, zinc, or the like, or mixtures thereof. For example, the inorganic hollow particles may include silica, mullite, alumina, silicon carbide (SiC), $MgO$—$Al_2O_3$—$SiO_2$, $Al_2O_3$—$SiO_2$, $MgO$—$Al_2O_3$—$SiO_2$—$Li_2O$, or mixtures thereof. With this composition, the inorganic hollow particles may help improve durability of the transparent conductive layer while maintaining a low refractive index of the transparent conductive layer.

In an implementation, the inorganic hollow particles may be present in the matrix composition in an amount of about 10 wt % to about 80 wt %, e.g., about 40 wt % to about 80 wt %, about 40 wt % to about 70 wt %, or about 50 wt % to about 70 wt %, in terms of solid content. Within this range, the inorganic hollow particles may help reduce the transmissive b* value of the transparent conductor while helping to improve transmittance thereof. In addition, within this range, the content of a binder may not be excessively low in the matrix composition, and it may be advantageous to form the matrix.

The inorganic hollow particles may include non-surface treated inorganic hollow particles or surface treated inorganic hollow particles subjected to surface treatment with a curable functional group, e.g., a (meth)acrylate group. For example, the surface treated inorganic hollow particles may help improve durability of the matrix and the transparent conductive layer through curing reaction with the binder of the matrix composition, and may be more firmly bound to the base layer. In an implementation, the surface treated inorganic hollow particles may be obtained through surface treatment of about 10% to about 80% of an entire outer surface of the inorganic hollow particles, e.g., about 20% to about 70% or about 40% to about 60%, with a (meth)acrylate compound. Within this range, the surface treated inorganic hollow particles may exhibit excellent reactivity with the binder to help improve durability of the transparent conductive layer, and may be more firmly bound to the base layer. The inorganic hollow particles subjected to surface treatment with the (meth)acrylate compound may be prepared by a suitable method or may be commercially obtained. The surface treated inorganic hollow particles may be obtained by, e.g., coating surfaces of hollow silica particles with a silane group-containing compound, followed by addition reaction with the (meth)acrylate compound. The surface treated inorganic hollow particles may have a refractive index of about 1.4 or less, e.g., about 1.33 to about 1.38. Within this range, it is possible to help reduce the transmissive b* value of the transparent conductor while improving transmittance of the transparent conductor. The description of the non-surface treated inorganic hollow particles may also be applied to the surface-treated inorganic hollow particles. In an implementation, the inorganic hollow particles may include a mixture of the non-surface treated inorganic hollow particles and the surface treated inorganic hollow particles.

The fluorine-containing monomer may have a low refractive index and thus may help reduce the refractive index of the matrix. The fluorine-containing monomer may undergo a curing reaction together with the binder in the matrix composition, thereby further reducing the refractive index of the matrix. In an implementation, the fluorine-containing monomer may be a low refractive index monomer having a refractive index of about 1.4 or less, e.g., about 1.33 to about 1.38. Within this range, the fluorine-containing monomer may help reduce the refractive index of the matrix, thereby reducing the transmissive b* value of the transparent conductor while improving transmittance thereof. In an implementation, the fluorine-containing monomer may include fluorine atoms in an amount of about 6 wt % or less, e.g., about 5 wt % or less or about 2 wt % to about 5 wt %, based on a solid content of the matrix composition. In an implementation, the fluorine-containing monomer may be present in the matrix composition in an amount of about 5 wt % to about 90 wt %, e.g., about 10 to about 70 wt % or about 40 wt % to about 70 wt %, in terms of solid content. Within this content range, it is possible to help control the refractive index and to reduce the transmissive b* value of the transparent conductor while improving transmittance thereof.

In an implementation, the fluorine-containing monomer may include, e.g., a fluorine-containing monomer having a pentaerythritol structure, a fluorine-containing monomer having a dipentaerythritol structure, a fluorine-containing monomer having a trimethylolpropane structure, a fluorine-containing monomer having a ditrimethylolpropane structure, a fluorine-containing monomer having a cyclohexyl structure, a fluorine-containing monomer having a linear structure, or mixtures thereof. For example, the fluorine-containing monomers may be used alone or in a mixture of two or more thereof.

In an implementation, the fluorine-containing monomer may be represented by one of the following Formulae 1 to 19.

<Formula 1>
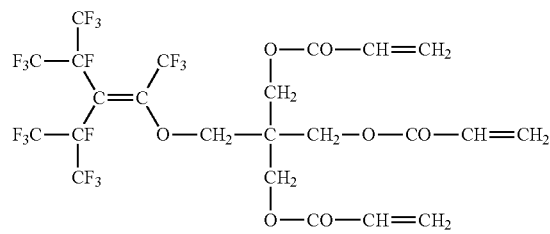

<Formula 2>
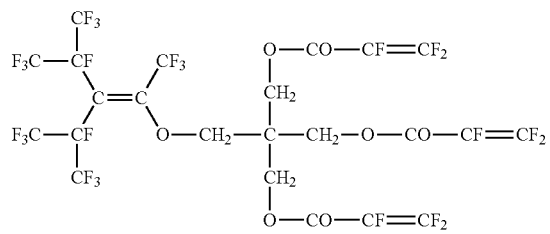

<Formula 3>
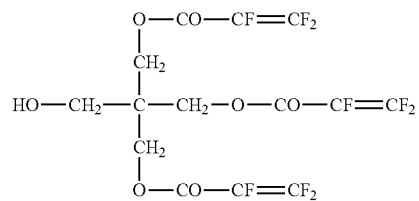

<Formula 4>
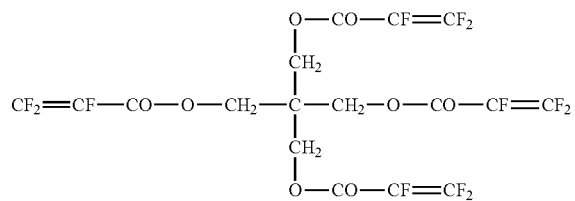

<Formula 5>
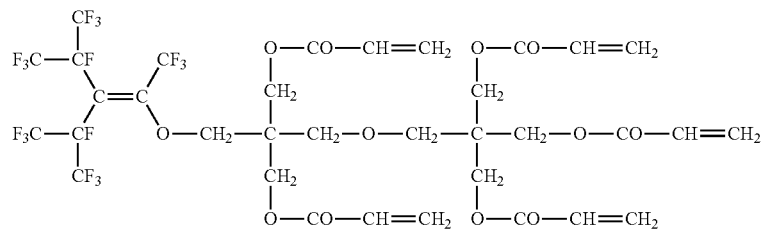

<Formula 6>
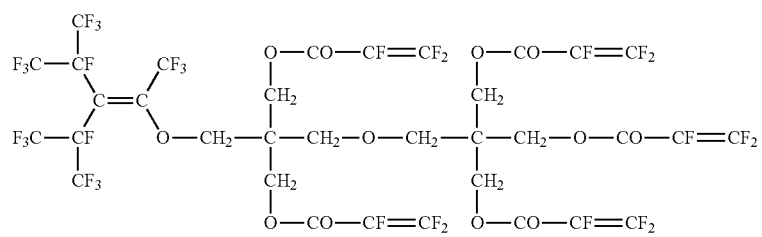

<Formula 7>
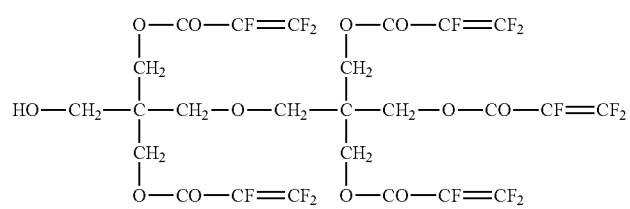

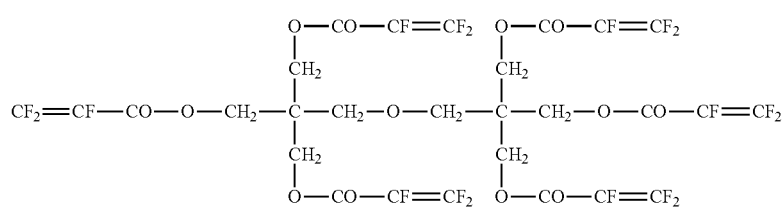

<Formula 8>

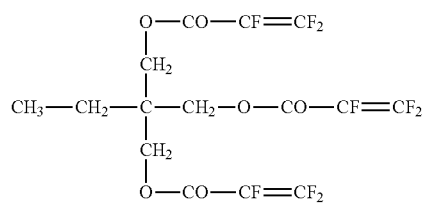

<Formula 9>

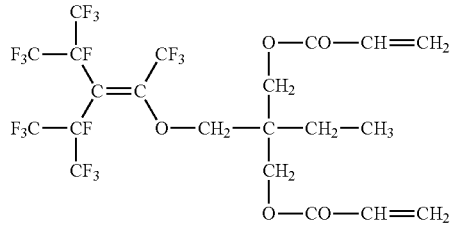

<Formula 10>

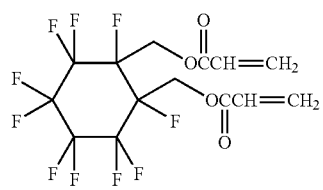

<Formula 11>

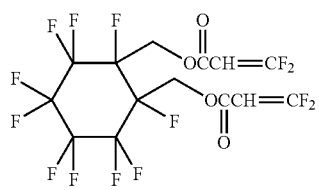

<Formula 12>

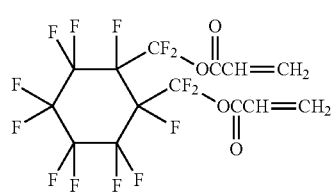

<Formula 13>

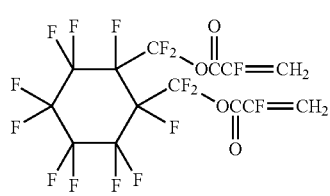

<Formula 14>

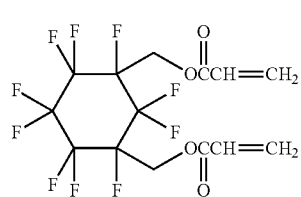

<Formula 15>

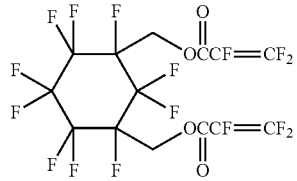

<Formula 16>

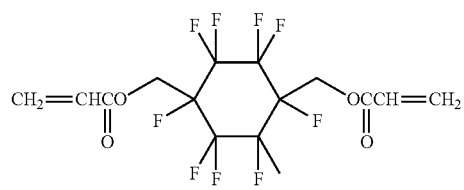

<Formula 17>

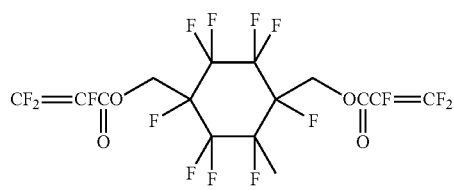

<Formula 18>

$(A)_n$—$(B)_m$

<Formula 19>

In Formula 19, A may include a $C_1$ to $C_{20}$ hydrocarbon group that includes fluorine; B may include an acrylate group, a methacrylate group, a fluorine-containing acrylate group, or a fluorine-containing methacrylate group; n may be an integer from 1 to 6; and m may be an integer from 1 to 16.

In an implementation, the matrix composition may include the mixture of the inorganic hollow particles and the fluorine-containing monomer. In this case, the mixture of the inorganic hollow particles and the fluorine-containing monomer may promote an increase in transmittance of the transparent conductor, e.g., the transparent conductor may exhibit further improved transmittance. In an implementation, a weight ratio of the inorganic hollow particles:the fluorine-containing monomer may be about 1:0.1 to about 1:9, e.g., about 1:0.1 to about 1:4 or about 1:0.1 to about 1:0.3. Within this range, the mixture may help decrease the transmissive b* value of the transparent conductor while further reducing sheet resistance.

In an implementation, the matrix composition may include, e.g., a binder and/or an initiator to facilitate formation of the matrix.

The binder may include a monofunctional monomer and/or a polyfunctional monomer. The polyfunctional monomer may include, e.g., bi- to hexa-functional monomers. For example, the monofunctional monomer or polyfunctional monomer may include a (meth)acrylate-based monomer. The (meth)acrylate-based monofunctional monomer or polyfunctional monomer may include a fluorine-containing monomer (that contains fluorine), or a non-fluorine-containing monomer (that does not contain fluorine). In an implementation, the (meth)acrylate-based monofunctional monomer or polyfunctional monomer may be a non-urethane monomer that does not contain a urethane group. In an implementation, the (meth)acrylate-based monofunctional monomer or polyfunctional monomer may include, e.g., linear or branched $C_1$ to $C_{20}$ alkyl group-containing (meth) acrylates, $C_1$ to $C_{20}$ (meth)acrylates having a hydroxyl group, $C_3$ to $C_{20}$ alicyclic group-containing (meth)acrylates, polyfunctional (meth)acrylates of $C_3$ to $C_{20}$ polyhydric alcohol, or mixtures thereof. In an implementation, the binder may include a penta-functional monomer or a hexa-functional monomer, and a tri-functional monomer. The penta-functional monomer or hexa-functional monomer may include penta-functional or hexa-functional (meth)acrylate monomers, e.g. penta-functional or hexa-functional monomers of $C_3$ to $C_{20}$ polyhydric alcohols. In an implementation, the binder may include a non-urethane penta-functional or a non-urethane hexa-functional monomer. For example, cured products may be densely stacked in a network structure of the metal nanowires 121, and adhesion of the matrix to the base layer 110 may be improved. In an implementation, the penta-functional or hexa-functional monomer may include, e.g., dipentaerythritol penta(meth)acrylate, dipentaerythritol hexa(meth)acrylate, caprolactone-modified dipentaerythritol penta(meth)acrylate, or caprolactone-modified dipentaerythritol hexa(meth)acrylate.

The tri-functional monomer may be a tri-functional (meth)acrylate monomer, and may include a non-urethane tri-functional monomer that does not contain a urethane group. For example, cured products may be densely stacked in a network structure of the metal nanowires 121, and adhesion of the matrix to the base layer 110 can be improved. The tri-functional monomer may include, e.g., a tri-functional monomer of a $C_3$ to $C_{20}$ polyhydric alcohol and an alkoxylated tri-functional monomer of a $C_3$ to $C_{20}$ polyhydric alcohol. In an implementation, the tri-functional monomer of the $C_3$ to $C_{20}$ polyhydric alcohol may include, e.g., trimethylolpropane tri(meth)acrylate, glycerol tri(meth) acrylate, pentaerythritol tri(meth)acrylate, or dipentaerythritol tri(meth)acrylate. As compared with the tri-functional monomer of the $C_3$ to $C_{20}$ polyhydric alcohol (that does not contain an alkoxy group), the alkoxylated tri-functional monomer of the $C_3$ to $C_{20}$ polyhydric alcohol may help further improve transmittance and reliability of the transparent conductor, while reducing the transmissive b* value of the transparent conductor, thereby helping to prevent the conductive layer from looking yellow due to color distortion. In an implementation, the tri-functional monomer having an alkoxy group (e.g., a $C_1$ to $C_5$ alkoxy group) may include, e.g., ethoxylated trimethylolpropane tri(meth)acrylate or propoxylated glyceryl tri(meth)acrylate.

In the matrix composition, the penta-functional or hexa-functional monomer and the tri-functional monomer may be present in a weight ratio of 1:1 to 5:1, e.g., 2:1 to 5:1, 2:1 to 3.5:1. Within this range, the transparent conductor 100 may exhibit improved transmittance and reliability. Maintaining the amount of the tri-functional monomer less than the amount of the penta-functional or hexa-functional monomer may help ensure that the matrix exhibits sufficient adhesion to the base layer 110 and has good reliability.

The initiator may be a suitable photo-polymerization initiator, and may include α-hydroxy ketone initiators, e.g. 1-hydroxycyclohexylphenylketone or mixtures thereof.

In an implementation, the matrix composition may include about 40 wt % to about 80 wt %, e.g., about 40 wt % to about 70 wt % of the inorganic hollow particles, the fluorine-containing monomer, or the mixture thereof, about 15 wt % to about 55 wt %, e.g., about 25 wt % to about 55 wt % of the binder, and about 0.1 wt % to about 5 wt % of the initiator, in terms of solid content. Within this content range, the matrix composition may facilitate formation of the matrix and may help improve transmittance of the transparent conductor by reducing the transmissive b* value of the transparent conductor.

In an implementation, the matrix composition may include, e.g., about 40 wt % to about 80 wt % of the inorganic hollow particles, the fluorine-containing monomer, or the mixture thereof, about 15 wt % to about 55 wt % of the binder, and about 0.1 wt % to about 5 wt % of the initiator, in terms of solid content. Within this content range, the matrix composition may facilitate formation of the matrix and may help improve transmittance of the transparent conductor by reducing the transmissive b* value of the transparent conductor.

In an implementation, the matrix composition may include, e.g., about 50 wt % to about 70 wt % of the inorganic hollow particles, about 5 wt % to about 40 wt % of the fluorine-containing monomer, about 5 wt % to 40 wt % of the binder, and about 0.1 wt % to about 5 wt % of the initiator, in terms of solid content. Within this content range, the matrix composition may help reduce the transmissive b* value of the transparent conductor through reduction of the refractive index of the matrix, thereby improving transmittance of the transparent conductor.

The matrix composition may include a solvent. The solvent may be a suitable solvent that neither dissolves the hollow particles nor deteriorates characteristics of the fluorine-containing monomer. For example, the solvent may include propylene glycol monomethyl ether or the like. In this case, the solvent may be present in a remaining weight or balance amount (excluding solid content) in the matrix composition having the aforementioned components.

In an implementation, the matrix composition may further include an antioxidant. The antioxidant may help prevent oxidation of the metal nanowire network of the transparent conductive layer 120. The antioxidant may include a mixture of one or more antioxidants, e.g., a mixture of two or more antioxidants, selected from among triazole-based antioxidants, triazine-based antioxidants, phosphorus-based antioxidants (such as a phosphite-based antioxidant and the like), HALS (hindered amine light stabilizer) antioxidants, and phenol-based antioxidants, to help prevent oxidation of the metal nanowires 121 while improving reliability. In the matrix composition, the antioxidant may be present in an amount of 0.01 wt % to 5 wt %, e.g., 0.5 wt % to 2 wt %. Within this range, the antioxidant may help prevent oxidation of the metal nanowires and may help secure high pattern uniformity of transparent electrodes formed by patterning the transparent conductor 100 to realize fine patterns.

The matrix formed of or prepared from the matrix composition according to this embodiment may have a low refractive index, thereby reducing the refractive index of the transparent conductive layer. In this case, the matrix may help increase the overall transmittance of the transparent conductor while reducing haze by allowing light reflected from the matrix to be offset by light reflected from the transparent conductive layer. In an implementation, a difference in refractive index between the base layer and the matrix may be set within the range of about 0.35 to about 0.02 to help improve transmittance of the transparent conductor.

In an implementation, the transparent conductive layer 120 may have a thickness of about 10 nm to about 200 nm, e.g., about 20 nm to about 200 nm, about 50 nm to about 200 nm, or about 70 nm to about 150 nm. Within this thickness range, the transparent conductive layer may be advantageously applied to a transparent conductor for flexible displays.

Next, a transparent conductor according to another embodiment will be described. The transparent conductor according to the present embodiment may have substantially the same features as those of the transparent conductor according to the previous embodiment. However, the transparent conductor according to the present embodiment may further include an additive, e.g., an adhesion promoter, a UV absorber, a thickening agent, a dispersant, or the like, in order to help improve performance of the matrix composition. In an implementation, the additive may be present in an amount of 0.01 wt % to 5 wt %, e.g., 1 to 5 wt %, in the matrix composition in terms of solid content. Within this range, the additive may help improve performance of the matrix composition without deteriorating the properties of the matrix.

Next, a transparent conductor according to a further embodiment will be described. The transparent conductor according to this embodiment may further include a functional layer stacked on one or both surfaces of the base layer. The functional layer may include, e.g., an anticorrosive layer, an antiglare coating layer, an adhesion promoting layer, or an oligomer elution prevention layer.

Figure 2:
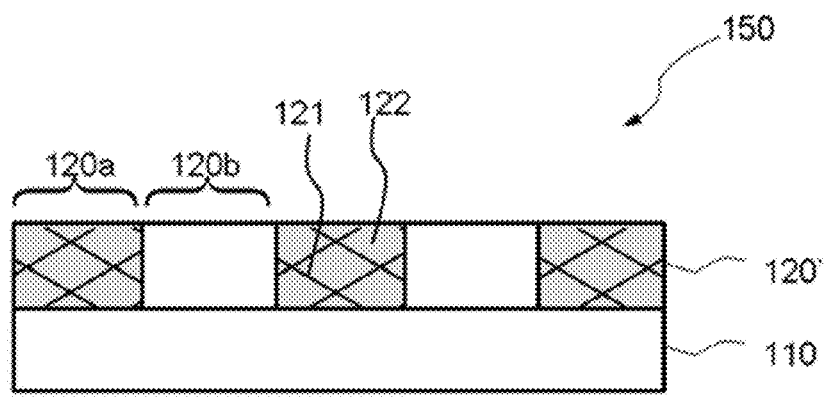
FIG. 2 illustrates a sectional view of a transparent conductor according to another embodiment.

Next, the transparent conductor according to this embodiment will be described with reference to FIG. 2. Referring to FIG. 2, the transparent conductor 150 according to this embodiment may include a base layer 110, and a conductive layer 120' on an upper surface of the base layer 110. The conductive layer 120' may be patterned to form a metal nanowire-containing conductive layer 120a, which includes metal nanowires 121 and a matrix 122, and a metal nanowire-free conductive layer 120b, which does not include the metal nanowires. The transparent conductor according to this embodiment may be substantially the same as the transparent conductor 100 according to the above embodiment, except that the conductive layer 120' is patterned.

The conductive layer 120' may be patterned by a suitable method, e.g., etching with an acid solution. Here, the conductive layer 120' may be patterned to form x and y channels to be used as conductors. For example, as shown in FIG. 2, the conductive layer 120' may be patterned to form a pattern including the metal nanowire-containing conductive layer 120a and the metal nanowire-free conductive layer 120b. Here, the metal nanowire-free conductive layer 120b may be composed of the matrix 122 without the metal nanowires 121.

The transparent conductors according to the embodiments described above may have a transmittance of 90% or more, e.g., 90% to 99%, and a resistance variation rate of 10% or less, e.g., 1% to 10%. Within this range, the transparent conductor 100 may have high transmittance and low resistance variation, and may be used as a transparent electrode film through patterning of the transparent conductor. As used herein, the term "resistance variation rate" may be measured on a transparent conductor, to which a 50~125 μm thick transparent adhesive film (Optically Clear Adhesives 8215, 3M Ltd.) and a 38~125 μm thick polyethylene terephthalate (PET) film are attached, after being left under conditions of 85° C. and 85% relative humidity (RH) for 240 hours. When the transparent conductor has a resistance variation rate of 10% or less, e.g. 1% to 10%, the transparent conductor is determined to have good reliability.

The transparent conductors according to the embodiments described above may exhibit transparency in a visible range, e.g., at a wavelength of about 400 nm to about 700 nm. In an implementation, the transparent conductor may have a haze value of about 0% to about 1.5%, e.g., about 0.01% to about 1.5% or about 0.01% to about 1.3%, as measured at a wavelength from about 400 nm to about 700 nm using a haze meter. Within this range, the transparent conductor may be used for purposes of a transparent conductor due to good transparency thereof.

The transparent conductors according to the embodiments described above may have a sheet resistance of about 100 Ω/□ or less, e.g., about 50 Ω/□ to about 100 Ω/□ or about 30 Ω/□ to about 100 Ω/□, as measured using a 4-probe tester. Within this range, the transparent conductor may be used as an electrode film for touch panels due to low sheet resistance and may be applied to large-area touch panels.

The transparent conductors according to the embodiments described above may have a thickness of about 10 μm to about 400 μm, e.g., 10 μm to about 250 μm, about 50 μm to about 200 μm or about 50 μm to about 150 μm. Within this range, the transparent conductor may be used as a transparent electrode film including a film for touch panels, and/or may be used as a transparent electrode film for flexible touch panels. The transparent conductor may be used in film form as a transparent electrode film of touch panels, e-paper, or solar cells through patterning by etching or the like.

Next, a method of fabricating a transparent conductor according to one embodiment will be described.

The method of fabricating the transparent conductor according to one embodiment may include, e.g., forming a metal nanowire network layer on one surface of a base layer; and over-coating a matrix composition including inorganic hollow particles, a fluorine-containing monomer, or a mixture thereof onto the metal nanowire network layer. In this case, it is possible to obtain a transparent conductor exhibiting excellent properties in terms of, e.g., conductivity, optical properties, chemical resistance, and reliability.

First, the metal nanowire network layer may be formed on the base layer using a metal nanowire composition. As used herein, a liquid composition in which the metal nanowires are dispersed may be referred to as the "metal nanowire composition". The metal nanowire composition may be a liquid composition in which the metal nanowires are dispersed, and may include a binder for dispersion of the metal nanowires. In this case, the metal nanowire composition may facilitate deposition and may help improve adhesion to the base layer. In the metal nanowire composition, the binder may include, e.g., carboxy methylcellulose (CMC), 2-hydroxy ethyl cellulose (HEC), hydroxy propyl methylcellulose (HPMC), methylcellulose (MC), polyvinyl alcohol (PVA), tripropylene glycol (TPG), polyvinylpyrrolidone, xanthan gum (XG), alkoxylates such as ethoxylates, ethylene oxide, propylene oxide, and copolymers thereof. The metal nanowire composition may be coated onto the base layer using a coating method, e.g., bar coating, spin coating, dip coating, roll coating, flow coating, die coating, or the like. The metal nanowire network layer may be formed on the base layer by coating the metal nanowire composition onto the base layer, followed by drying. Drying may be performed, e.g., at about 80° C. to about 140° C. for about 1 minute to about 30 minutes.

Then, a transparent conductive layer may be formed on the metal nanowire network layer using the matrix composition. The matrix composition may include a binder and an initiator. In an implementation, the matrix composition may further include a solvent. Details of the matrix composition may be the same as those of the transparent conductors according to the embodiments as described above.

The matrix composition may be coated onto the metal nanowire network layer using a coating method, e.g., bar coating, spin coating, dip coating, roll coating, flow coating, die coating, or the like.

The matrix composition coated onto the metal nanowire network layer may permeate the metal nanowire network layer. Thus, the metal nanowires may be impregnated with the matrix composition, thereby forming a conductive layer including the metal nanowires and a matrix. The metal nanowires may be completely impregnated with the matrix, or may be partially exposed to a surface of the conductive layer.

The method may further include drying the matrix composition after coating the matrix composition. For example, the matrix composition may be dried at about 80° C. to about 120° C. for about 1 minute to about 30 minutes.

After drying the matrix composition, the method may further include curing by performing, e.g., photocuring or thermal curing. Photocuring may be performed by irradiation of light having a wavelength of 400 nm or less at an intensity of 300 mJ/cm$^2$ to about 1000 mJ/cm$^2$, and thermal curing may include thermal curing performed at 50° C. to 200° C. for 1 hour to 120 hours.

The method may further include patterning the cured transparent conductive layer by etching or the like.

Next, devices according to embodiments will be described. The devices according to embodiment may include the transparent conductor according to the embodiments as described above. For example, the devices according to embodiments may include optical displays such as touch panels, touchscreen panels, flexible displays, and the like; e-paper; or solar cells. It should be noted that in the description relating to FIGS. 3 to 7, the term "glass" may mean not only a glass sheet formed of a glass materials but also a glass sheet formed of a transparent plastic film.

Figure 3:
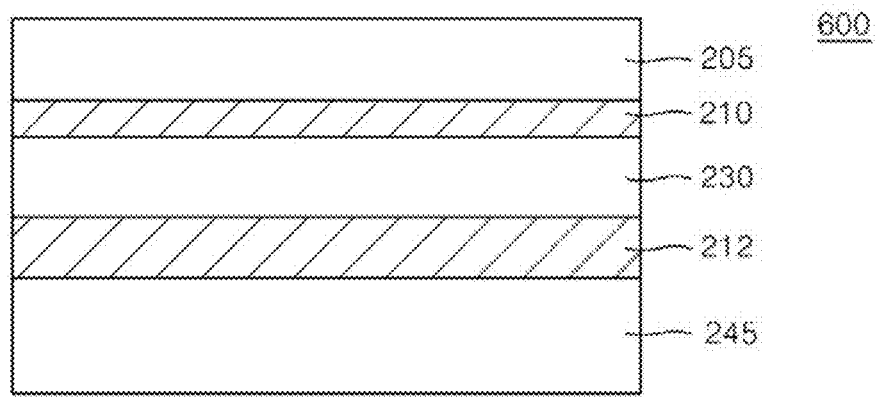
FIG. 3 illustrates a sectional view of an optical display according to an embodiment.

Next, an optical display according to one embodiment will be described with reference to FIG. 3. FIG. 3 illustrates a sectional view of an optical display according to one embodiment.

Referring to FIG. 3, an optical display 600 according to one embodiment may include a display panel 245; a transparent electrode structure 230 on the display panel; and a window glass 205 on the transparent conductor.

The display panel 245 may be a liquid crystal display (LCD) panel, an organic light emitting diode (OLED) panel, or a light emitting diode (LED) panel. When the display panel 245 is an OLED panel, an encapsulation layer may be formed on the OLED panel to help shield moisture and oxygen.

In an implementation, adhesive films 210, 212 may be disposed between the display panel 245 and the transparent electrode structure 230 and between the transparent electrode structure 230 and the window glass 205.

The transparent electrode structure 230 may include the transparent conductor according to the embodiments.

The window glass 205 may perform a screen display function in the optical display and may be prepared from a suitable glass material or a transparent plastic material.

The adhesive films 210, 212 may be suitable adhesive films, e.g., optically clear adhesive (OCA) films.

Figure 4:
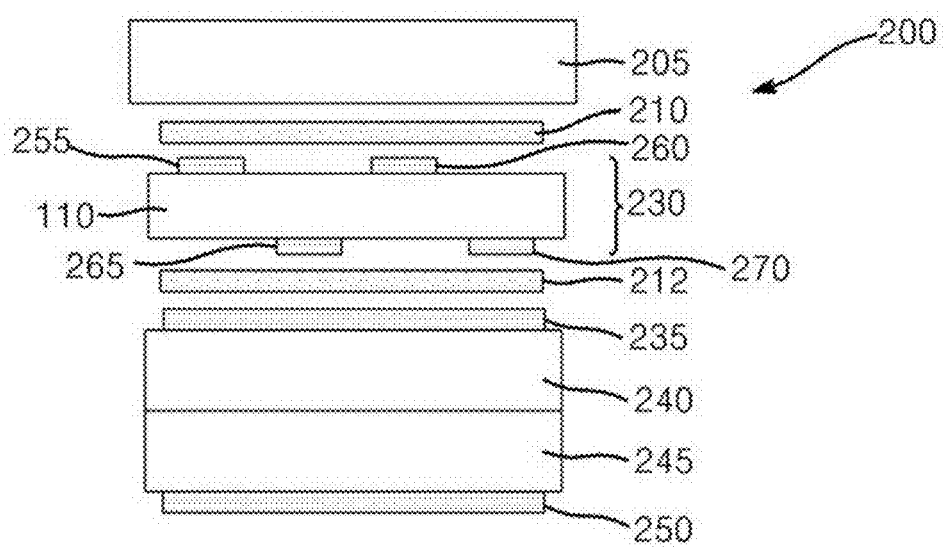
FIG. 4 illustrates a sectional view of an optical display according to another embodiment.

Next, an optical display 200 according to another embodiment will be described with reference to FIG. 4. FIG. 4 illustrates a sectional view of an optical display according to another embodiment. The optical display 200 according to this embodiment may include: a transparent electrode structure 230 including a base layer 110, first and second electrodes 255, 260 on an upper surface of the base layer 110, and third and fourth electrodes 265, 270 on a lower surface of the base layer 110; a window glass 205 placed above the first and second electrodes 255, 260; a first polarizing plate 235 placed below the third and fourth electrodes 265, 270; an upper substrate 240 placed on a lower surface of the first polarizing plate 235; a display panel 245 placed on a lower surface of the upper substrate 240; and a second polarizing plate 250 placed on a lower surface of the display panel 245. Here, the upper substrate 240 may be a color filter (CF) glass, an encapsulation glass, or the like. The display panel 245 may be an LCD, OLED, or LED. In an implementation, the display panel 245 may include a thin film transistor (TFT) glass and the second polarizing plate 250 may be formed on the lower surface of the TFT glass.

The transparent electrode structure 230 may include the transparent conductor according to the embodiments. The transparent electrode structure 230 may be manufactured by patterning the transparent conductive layer according to the embodiments using a suitable method (for example, etching and the like) to form the first, second, third, and fourth electrodes. The first and second electrodes 255, 260 may be Rx electrodes, and the third and fourth electrodes 265, 270 may be Tx electrodes, or vice versa.

The window glass 205 may perform a screen display function in the optical display and may be prepared from a suitable glass material or a transparent plastic material.

The first and second polarizing plates 235, 250 may impart polarization capabilities to the optical display and may polarize external or internal light. In addition, each of the first and second polarizing plates 235, 250 may include a polarizer or a stacked body of a polarizer and a protective film, and the polarizer and the protective film may include suitable polarizers and protective films, respectively. Adhesive films 210, 212 may be disposed between the window glass 205 and the transparent electrode structure 230 and between the transparent electrode structure 230 and the first polarizing plate 235, respectively, thereby maintaining bonding between the transparent electrode structure 230, the window glass 205, and the first polarizing plate 235. The adhesive films 210, 212 may be suitable adhesive films and may include, e.g., an optically clear adhesive (OCA) film.

Figure 5:
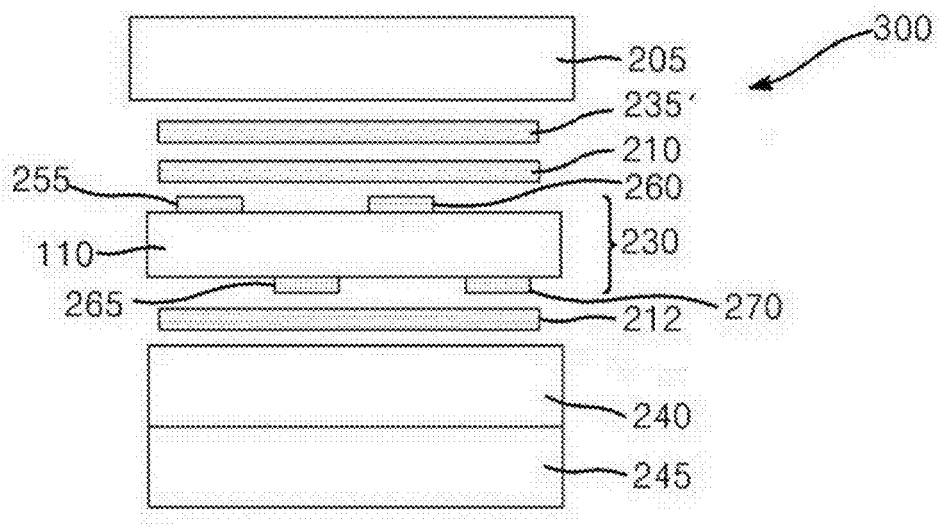
FIG. 5 illustrates a sectional view of an optical display according to a further embodiment.

Next, an optical display 300 according to a further embodiment will be described with reference to FIG. 5. FIG. 5 illustrates a sectional view of an optical display according to a further embodiment. The optical display 300 according to this embodiment may include: a transparent electrode structure 230 including a base layer 110, first and second electrodes 255, 260 formed on an upper surface of the base layer 110, and third and fourth electrodes 265, 270 formed on a lower surface of the base layer 110; a first polarizing plate 235' placed above the first and second electrodes 255, 260; a window glass 205 placed above the first polarizing plate 235'; an upper substrate 240 placed below the third and fourth electrodes 265, 270; and a display panel 245 including a thin film transistor(TFT) glass, placed on a lower surface of the upper substrate 240. Here, the upper substrate 240 may be a color filter (CF) glass, an encapsulation glass, or the like. In an implementation, the display panel 245 may be an LCD, OLED, or LED.

The transparent electrode structure 230 may include the transparent conductor according to the embodiments. The transparent electrode structure 230 may be manufactured by patterning the transparent conductive layer using a suitable method (e.g., etching and the like) to form the first, second, third, and fourth electrodes. The first and second electrodes 255, 260 may be Rx electrodes, and the third and fourth electrodes 265, 270 may be Tx electrodes, or vice versa.

The window glass 205 may perform a screen display function in the optical display and may be prepared from a suitable glass material or a transparent plastic material.

The polarizing plate 235' may impart polarization capabilities to the optical display and may polarize external or internal light. In addition, the polarizing plate 235' may include a polarizer, a stacked body of a polarizer and a protective film, or an integrated monolayer structure of the polarizer and the protective film. The polarizer and the protective film may include suitable polarizers and protective films, respectively. Adhesive films 210, 212 may be disposed between the polarizing plate 235' and the window glass 205 and between the transparent electrode structure 230 and the polarizing plate 235', respectively, thereby maintaining bonding between the transparent electrode structure 230, the window glass 205, and the polarizing plate 235'. The adhesive films 210, 212 may be suitable adhesive films and may include, e.g., optically clear adhesive (OCA) films.

Figure 6:
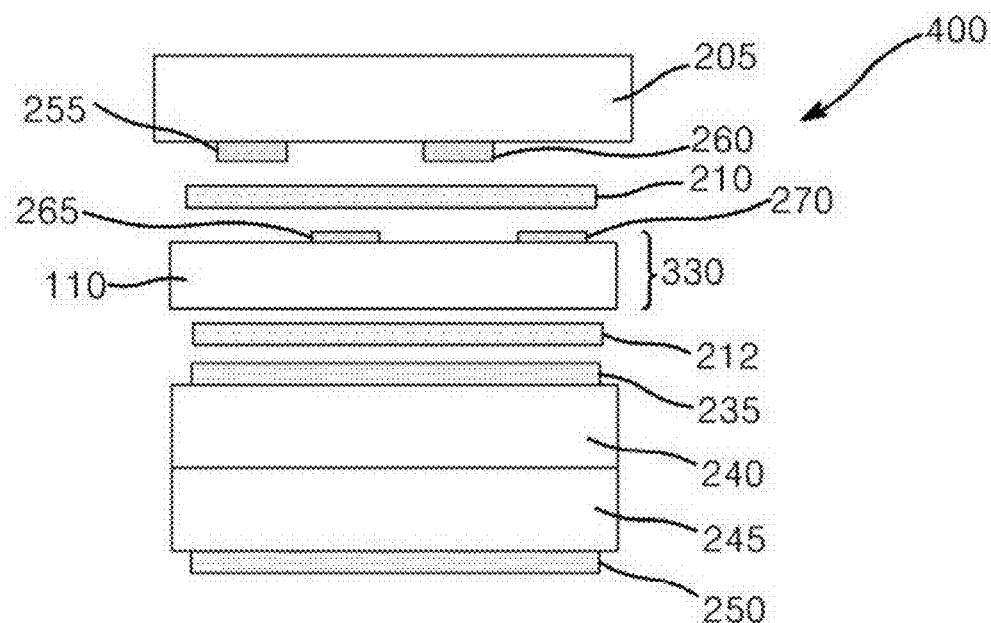
FIG. 6 illustrates a sectional view of an optical display according to yet another embodiment.

Next, an optical display 400 according to yet another embodiment will be described with reference to FIG. 6. Referring to FIG. 6, the optical display 400 according to this embodiment may include: a transparent electrode structure 330 including a base layer 110 and third and fourth electrodes 265, 270 formed on an upper surface of the base layer 110; a window glass 205 placed above the third and fourth electrodes 265, 270 and including first and second electrodes 255, 260 formed on a lower surface thereof; a first polarizing plate 235 placed below the transparent electrode structure 330; an upper substrate 240 placed on a lower surface of the first polarizing plate 235; a display panel 245 placed on a lower surface of the upper substrate 240; and a second polarizing plate 250 placed on a lower surface of the display panel 245. In an implementation, the upper substrate 240 may be a color filter (CF) glass, an encapsulation glass, or the like. The display panel 245 may be an LCD, OLED, or LED. In an implementation, the display panel 245 may include a thin film transistor (TFT) glass and the second polarizing plate 250 may be formed on the lower surface of the TFT glass.

The transparent electrode structure 330 may include the transparent conductor according to the embodiments. The transparent electrode structure 330 may be manufactured by patterning the transparent conductor using a suitable method to form the third and fourth electrodes 265, 270. The first and second electrodes 255, 260 may be formed by a suitable electrode formation method. Adhesive films 210, 212 may be disposed between the window glass 205 and the transparent electrode structure 330 and between the transparent electrode structure 330 and the first polarizing plate 235, respectively, thereby maintaining bonding between the transparent electrode structure, the window glass, and the first polarizing plate.

Figure 7:
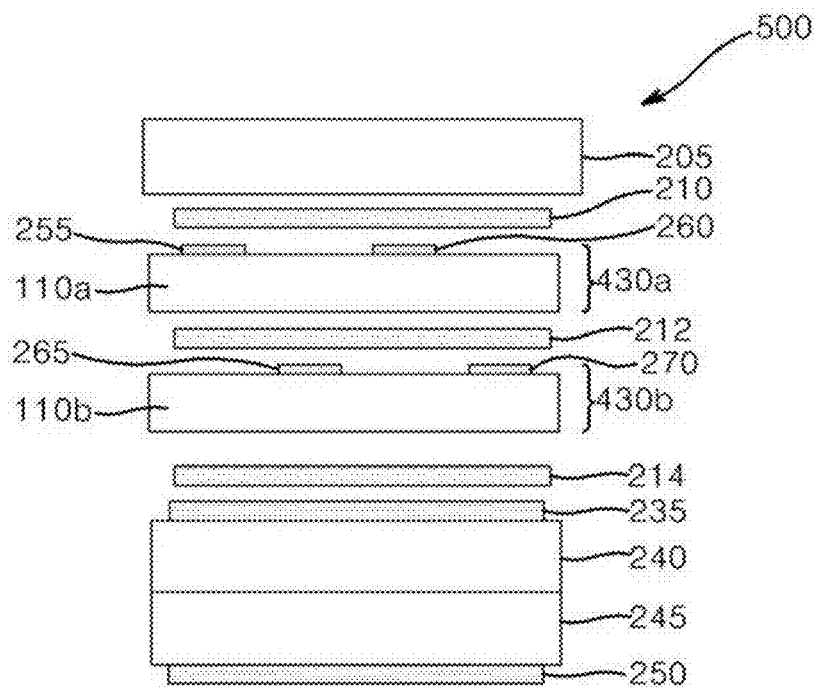
FIG. 7 illustrates a sectional view of an optical display according to yet another embodiment.

Next, an optical display 500 according to yet another embodiment will be described with reference to FIG. 7. Referring to FIG. 7, the optical display 500 according to this embodiment may include: a first transparent electrode structure 430a including a first base layer 110a and first and second electrodes 255, 260 formed on an upper surface of the first base layer 110a; a second transparent electrode structure 430b formed below the first transparent electrode structure 430a and including a second base layer 110b and third and fourth electrodes 265, 270 formed on an upper surface of the second base layer 110b; a first polarizing plate 235 formed below the second transparent electrode structure 430b; an upper substrate 240 placed on a lower surface of the first polarizing plate 235; a display panel 245 placed on a lower surface of the upper substrate 240; and a second polarizing plate 250 placed on a lower surface of the display panel 245. The first transparent electrode structure 430a and the second transparent electrode structure 430b may include the transparent conductors according to the embodiments. In an implementation, the upper substrate 240 may be a color filter (CF) glass, an encapsulation glass, or the like. The display panel 245 may be an LCD, OLED, or LED. In an implementation, the display panel 245 may include a thin film transistor (TFT) glass and the second polarizing plate 250 may be formed on the lower surface of the TFT glass.

The first transparent electrode structure 430a and the second transparent electrode structure 430b may be manufactured by forming the first, second, third, and fourth electrodes by patterning the transparent conductor using a suitable method.

Adhesive films 210, 212, 214 may be disposed between the first transparent electrode structure 430a and the window glass 205, between the first transparent electrode structure 430a and the second transparent electrode structure 430b, and between the second transparent electrode structure 430b and the first polarizing plate 235, respectively, thereby maintaining bonding between the transparent electrode structures, the window glass and the first polarizing plate. The adhesive films 210, 212, 214 may be suitable adhesive films and may include, e.g., optically clear adhesive (OCA) films.

Figure 8:
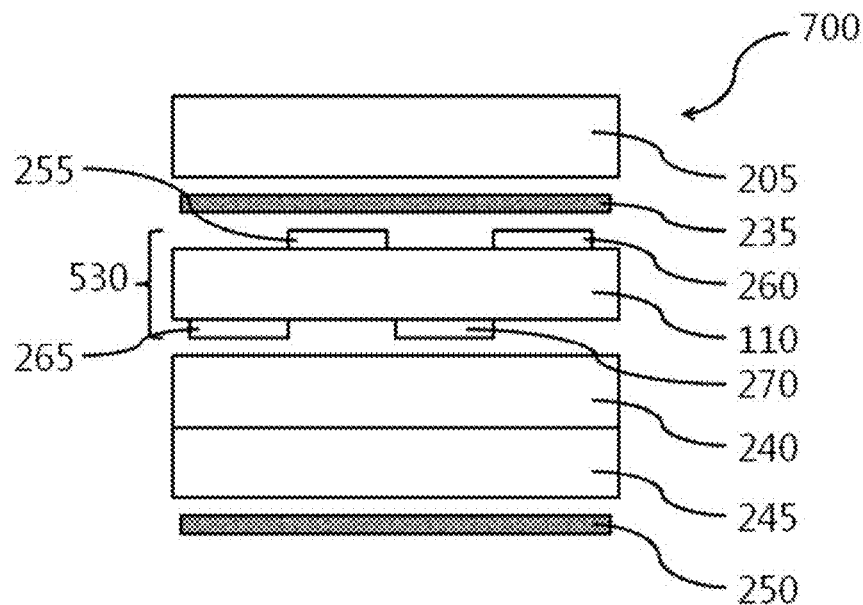
FIG. 8 illustrates a sectional view of an optical display according to yet another embodiment.

Next, an optical display apparatus 700 according to yet another embodiment will be described with reference to FIG. 8. FIG. 8 illustrates a sectional view of an optical display according to yet another embodiment. The optical display 700 according to this embodiment may include: a transparent electrode structure 530 including a base layer 110, first and second electrodes 255, 260 formed on an upper surface of the base layer 110, and third and fourth electrodes 265, 270 formed on a lower surface of the base layer 110; a first polarizing plate 235 placed above the first and second electrodes 255, 260; a window glass 205 placed above the first polarizing plate 235; an upper substrate 240 placed below the third and fourth electrodes 265, 270; and a display panel 245 placed on a lower surface of the upper substrate 240. In an implementation, the upper substrate 240 may be a color filter (CF) glass, an encapsulation glass, or the like. In an implementation, the display panel 245 may have a structure in which a lower substrate such as a thin film transistor (TFT) is formed on a lower side of an optical device, such as an LCD, OLED, or LED. Further, a second polarizing plate 250 may be formed below the display panel 245.

The transparent electrode structure 530 may include the transparent conductor according to the embodiments. The transparent electrode structure 530 may be manufactured by patterning the transparent conductive layer using a suitable method (e.g., etching and the like) to form the first, second, third, and fourth electrodes. The first and second electrodes 255, 260 may be Rx electrodes, and the third and fourth electrodes 265, 270 may be Tx electrodes, or vice versa.

The window glass 205 may perform a screen display function in the optical display and may be prepared from a suitable glass material or a transparent plastic material.

The first and second polarizing plates 235, 250 may impart polarization capabilities to the optical display and may polarize external or internal light. In addition, each of the first and second polarizing plates 235, 250 may include a polarizer or a stacked body of a polarizer and a protective film, and the polarizer and the protective film may include suitable polarizers and protective films, respectively. Although not shown in the drawings, adhesive films may be disposed between the window glass 205 and the first polarizing plate 235 and between the transparent electrode structure 530 and the first polarizing plate 235, respectively, thereby maintaining bonding between the transparent electrode structure 530, the first polarizing plate 235, and the window glass 205. In addition, an adhesive film may be further disposed between the second polarizing plate and a thin film transistor (TFT) glass of the display panel 245. The adhesive films may be suitable adhesive films and may include, e.g., an optically clear adhesive (OCA) film.

Figure 9:
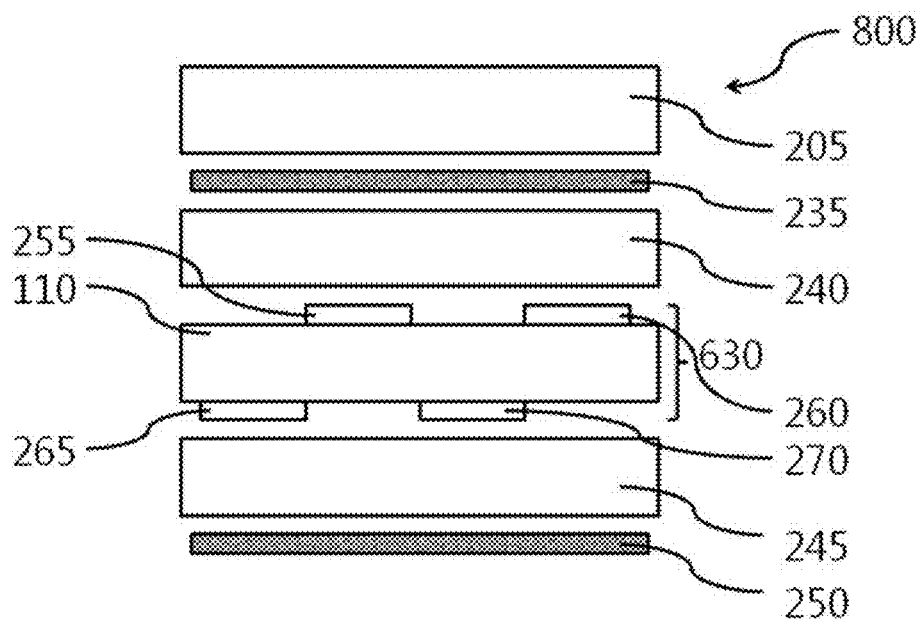
FIG. 9 illustrates a sectional view of an optical display according to yet another embodiment.

Next, an optical display 800 according to yet another embodiment will be described with reference to FIG. 9. FIG. 9 illustrates a sectional view of an optical display according to yet another embodiment. The optical display 800 according to this embodiment may include: a transparent electrode structure 630 including a base layer 110, first and second electrodes 255, 260 formed on an upper surface of the base layer 110, and third and fourth electrodes 265, 270 formed on a lower surface of the base layer 110; an upper substrate 240 placed above the first electrode 255 and the second electrode 260; a first polarizing plate 235 placed on an upper surface of the upper substrate 240; a window glass 205 placed on an upper surface of the first polarizing plate 235; a display panel 245 placed below the third electrode 265 and the fourth electrode 270; and a second polarizing plate placed on a lower surface of the display panel 245. In an implementation, the upper substrate 240 may be a color filter (CF) glass, an encapsulation glass, or the like. In an implementation, the display panel 245 may have a structure in which a lower substrate such as a thin film transistor (TFT) is formed on a lower side of an optical display device, such as an LCD, OLED, or LED.

The transparent electrode structure 630 may include the transparent conductor according to the embodiments. The transparent electrode structure 630 may be manufactured by patterning the transparent conductive layer using a suitable method (e.g., etching and the like) to form the first, second, third, and fourth electrodes. The first and second electrodes 255, 260 may be Rx electrodes, and the third and fourth electrodes 265, 270 may be Tx electrodes, or vice versa.

The window glass 205 may perform a screen display function in the optical display and may be prepared from a suitable glass material or a transparent plastic material.

The first and second polarizing plates 235, 250 may impart polarization capabilities to the optical display and may polarize external or internal light. In addition, each of the first and second polarizing plates 235, 250 may include a polarizer or a stacked body of a polarizer and a protective film, and the polarizer and the protective film may include suitable polarizers and protective films, respectively. Although not shown in the drawing, adhesive films may be disposed between the window glass 205 and the first polarizing plate 235, between the first polarizing plate 235 and the upper substrate 240, and between the display panel 245 and the second polarizing plate 250, respectively, thereby maintaining bonding between the upper substrate 240, the first polarizing plate 235, and the window glass 205. In addition, an adhesive film may be disposed between the second polarizing plate and a thin film transistor (TFT) glass of the display panel 245. The adhesive films may be suitable adhesive films and may include, e.g., an optically clear adhesive (OCA) film.

In addition, although not shown in FIGS. 3 to 9, the base layer may also have a structure in which resin films are stacked via adhesives and the like.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Example 1

50 wt % of a metal nanowire solution (including 2.45 wt % of a total sum of metal nanowires and a binder (weight ratio of metal nanowires to binder=1:1.45), and 1 wt % or less of a thickening agent, a dispersant, and the like, and a solvent, Product name: ClearOhm Ink, Cambrios Co., Ltd.) was added to 50 wt % of ultrapure distilled water, followed by stirring, thereby preparing a metal nanowire composition.

0.35 wt % of dipentaerythritol hexaacrylate (DPHA), 0.1 wt % of trimethylolpropane triacrylate (TMPTA), 0.5 wt % of inorganic hollow particles (XJA-2502-LR, Average particle diameter: 60 nm, Refractive index: 1.36, Surface treated particles), and 0.05 wt % of Irgacure-184 (CIBA Co., Ltd.) were mixed with 99 wt % of propylene glycol monomethyl ether, thereby preparing a matrix composition.

The metal nanowire composition was coated onto a polycarbonate film (thickness: 50 μm) using a spin coater, followed by drying in an oven at 80° C. for 2 minutes. Next, the matrix composition was coated onto the metal nanowire layer using a spin coater, followed by drying in an oven at 80° C. for 2 minutes, and then subjected to UV curing at 500 mJ/cm$^2$ to form an about 85 nm thick transparent conductive layer, thereby preparing a transparent conductor.

Example 2

A transparent conductor was prepared in the same manner as in Example 1 except that a matrix composition was prepared by mixing 99 wt % of propylene glycol monomethyl ether, 0.125 wt % of DPHA, 0.125 wt % of TMPTA, 0.7 wt % of inorganic hollow particles (XJA-2502-LR, Average particle diameter: 60 nm, Refractive index: 1.36, Surface treated particles), and 0.05 wt % of Irgacure-184 (CIBA Co., Ltd.).

Example 3

A transparent conductor was prepared in the same manner as in Example 1 except that a matrix composition was prepared by mixing 99 wt % of propylene glycol monomethyl ether, 0.125 wt % of DPHA, 0.125 wt % of TMPTA, 0.7 wt % of a fluorine-containing monomer (LINC-3A, Kyoeisha Co., Ltd.), and 0.05 wt % of Irgacure-184.

Example 4

A transparent conductor was prepared in the same manner as in Example 1 except that a matrix composition was prepared by mixing 99 wt % of propylene glycol monomethyl ether, 0.035 wt % of DPHA, 0.015 wt % of TMPTA, 0.7 wt % of inorganic hollow particles (XJA-2502-LR, Average particle diameter: 60 nm, Refractive index: 1.36, Surface treated particles), 0.2 wt % of a fluorine-containing monomer (LINC-3A, Kyoeisha Co., Ltd.), and 0.05 wt % of Irgacure-184.

Example 5

A transparent conductor was prepared in the same manner as in Example 1 except that a matrix composition was prepared by mixing 99 wt % of propylene glycol monomethyl ether, 0.105 wt % of DPHA, 0.045 wt % of TMPTA, 0.7 wt % of inorganic hollow particles (XJA-2502-LR, Average particle diameter: 60 nm, Refractive index: 1.36, Surface treated particles), 0.1 wt % of a fluorine-containing monomer (AR-110, DAIKIN Co., Ltd.), and 0.05 wt % of Irgacure-184.

Example 6

A transparent conductor was prepared in the same manner as in Example 1 except that a matrix composition was prepared by mixing 99 wt % of propylene glycol monomethyl ether, 0.10 wt % of DPHA, 0.04 wt % of TMPTA, 0.7 wt % of inorganic hollow particles (XJA-2502-LR, Average particle diameter: 60 nm, Refractive index: 1.36, Surface treated particles), 0.1 wt % of a fluorine-containing monomer (AR-110, DAIKIN Co., Ltd.), 0.05 wt % of Irgacure-184, and 0.005 wt % of Tinuvin 152 (BASF) and 0.005 wt % of Igafos 168 (BASF) as antioxidants.

Comparative Example 1

A transparent conductor was prepared in the same manner as in Example 1 except that a matrix composition was prepared by mixing 99 wt % of propylene glycol monomethyl ether, 0.7 wt % of DPHA, 0.295 wt % of TMPTA, 0 wt % of inorganic hollow particles (i.e., the inorganic hollow particles were omitted), and 0.05 wt % of Irgacure-184.

Comparative Example 2

A transparent conductor was prepared in the same manner as in Example 1 except that a matrix composition was prepared by mixing 99 wt % of propylene glycol monomethyl ether, 0.315 wt % of DPHA, 0.135 wt % of TMPTA, 0.5 wt % of spherical(non hollow) silica nanoparticles (SST450V, Ranco Co., Ltd., Average particle diameter: 30 nm), and 0.05 wt % of Irgacure-184.

Each of the transparent conductors prepared in the Examples and Comparative Examples was evaluated as to the following properties. Results are shown in Table 1.

(1) Sheet resistance ($\Omega$/□): Sheet resistance on a surface of the transparent conductor was measured using a non-contact sheet resistance meter (EC-80P, NAPSON Co., Ltd.).

(2) Haze and Total transmittance (%): The transparent conductive film of the transparent conductor was placed to face a light source, followed by measuring haze and total transmittance at a wavelength of 400 nm to 700 nm using a haze meter (NDH-9000).

(3) Transmissive b* value: Transmissive color coordinates were measured on the transparent conductors prepared in the Examples and Comparative Examples (Thickness of polycarbonate film: 50 μm, Thickness of conductive layer including metal nanowires and matrix: 85 nm) at a wavelength of 400 nm to 700 nm using a spectrophotometer (Illuminant 65 degrees, Observer 2 degrees) CM 3600D (Konica Minolta Co., Ltd.).

TABLE 1

| | | Example | | | | | | Comparative Example | |
|---|---|---|---|---|---|---|---|---|---|
| | | 1 | 2 | 3 | 4 | 5 | 6 | 1 | 2 |
| Matrix composition, solid content (wt %) | Inorganic hollow particles XJA-2502-LR | 50 | 70 | — | 70 | 70 | 70 | — | — |
| | Fluorine-containing monomer LINC-3A | — | — | 70 | 20 | — | — | — | — |
| | Fluorine-containing monomer AR-110 | — | — | — | — | 10 | 10 | — | — |
| | Non-hollow inorganic particles SST450V (nanosilica) | — | — | — | — | — | — | — | 50 |
| | Antioxidant | — | — | — | — | — | 1 | — | — |
| transmissive b* | | 0.76 | 0.70 | 0.84 | 0.60 | 0.66 | 0.65 | 1.25 | 1.12 |
| Haze (%) | | 1.18 | 1.13 | 1.13 | 1.04 | 1.14 | 1.05 | 1.10 | 1.02 |
| Transmittance (%) | | 92.22 | 92.46 | 90.53 | 92.15 | 92.55 | 92.20 | 91.16 | 91.41 |
| Sheet resistance ($\Omega$/□) | | 56.22 | 54.41 | 53.02 | 50.47 | 51.21 | 49.75 | 60.19 | 55.25 |

As shown in Table 1, it may be seen that the transparent conductors of Examples 1 to 6 exhibited good optical properties by securing low haze and high transmittance, and could prevent color distortion by securing low transmissive b* value.

On the contrary, the transparent conductor of Comparative Example 1 (prepared without using the inorganic hollow particles and the fluorine-containing monomer) exhibited a high haze value under the same resistance. In the transparent conductor of Comparative Example 1 and the transparent conductor of Comparative Example 2 (which was prepared without using the fluorine-containing monomer and included solid, i.e., non-hollow, silica particles), there was color distortion due to an increase in transmissive b* value, and deterioration in optical properties such as transmittance, haze, and the like.

By way of summation and review, although a transparent conductor (including a transparent conductive layer containing silver nanowires) may exhibit excellent flexural properties, the transparent conductive layer further includes a matrix for improvement of durability and adhesion to a base layer. The matrix may increase a transmissive b* value of the transparent conductive layer (among color difference coefficients), and the transparent conductors may suffer from color distortion and deterioration in optical properties such as transmittance, haze, or the like. In addition, the transparent conductive layer containing silver nanowires may look yellow due to the silver nanowires.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A transparent conductor, comprising:
   a base layer; and
   a conductive layer on the base layer, the conductive layer including metal nanowires and a matrix,
   wherein:
   the matrix is prepared from a matrix composition, the matrix composition including inorganic hollow particles and a fluorine-containing monomer, and
   the transparent conductor has a transmissive b* value of about 1.0 or less.

2. The transparent conductor as claimed in claim 1, wherein:
   the inorganic hollow particles have a refractive index of about 1.4 or less.

3. The transparent conductor as claimed in claim 1, wherein the inorganic hollow particles are included in the matrix composition in an amount of about 10 wt % to about 70 wt %, in terms of solid content.

4. The transparent conductor as claimed in claim 1, wherein:
   the inorganic hollow particles include an oxide, a carbide, or a nitride of at least one of silicon, aluminum, magnesium, lithium, zirconium, or zinc.

5. The transparent conductor as claimed in claim 1, wherein:
   the matrix composition includes about 6 wt % or less of fluorine atoms, in terms of solid content.

6. The transparent conductor as claimed in claim 1, wherein the matrix composition includes:
   about 40 wt % to about 80 wt % of the inorganic hollow particles and the fluorine-containing monomer;
   about 15 wt % to about 55 wt % of a binder; and
   about 0.1 wt % to about 5 wt % of an initiator, all wt % being in terms of solid content.

7. The transparent conductor as claimed in claim 1, wherein the metal nanowires include silver nanowires.

8. The transparent conductor as claimed in claim 1, further comprising at least one of an anticorrosive layer on an upper surface or a lower surface of the base layer, an antiglare coating layer on an upper surface or a lower surface of the base layer, an adhesion promoting layer on an upper surface or a lower surface of the base layer, or an oligomer elution prevention layer on an upper surface or a lower surface of the base layer.

9. The transparent conductor as claimed in claim 1, wherein the matrix composition further includes:
   a tri-functional monomer, and
   a polyfunctional monomer, the polyfunctional monomer including a penta-functional monomer or a hexa-functional monomer.

10. The transparent conductor as claimed in claim 9, wherein the tri-functional monomer includes a (meth)acrylate-based monomer.

11. The transparent conductor as claimed in claim 9, wherein the tri-functional monomer includes an alkoxylated (meth)acrylate-based monomer.

12. The transparent conductor as claimed in claim 9, wherein the matrix composition further includes at least one of an adhesion promoter, a UV absorber, a thickening agent, and a dispersant.

13. The transparent conductor as claimed in claim 9, wherein a weight ratio of the penta-functional monomer or hexa-functional monomer to the tri-functional monomer is 1:1 to 5:1.

14. A method of fabricating a transparent conductor, the method comprising:
   forming a metal nanowire network layer on a base layer; and
   forming a conductive layer on the metal nanowire network layer using a matrix composition, the matrix composition including inorganic hollow particles and a fluorine-containing monomer,
   wherein the transparent conductor has a transmissive b* value of about 1.0 or less.

15. The method as claimed in claim 14, wherein the matrix composition further includes:
   a tri-functional monomer, and
   a polyfunctional monomer, the polyfunctional monomer including a penta-functional monomer or a hexa-functional monomer.

16. An optical display comprising the transparent conductor as claimed in claim 1.

17. An optical display, comprising:
   a display panel;
   a transparent conductor on the display panel; and
   a window on the transparent conductor,
   wherein the transparent conductor includes the transparent conductor as claimed in claim 1.

18. The optical display as claimed in claim 17, wherein the display panel includes a liquid crystal display panel, an organic light emitting diode display panel, or a light emitting diode display panel.

19. The transparent conductor as claimed in claim 1, wherein:
   the matrix composition includes the fluorine-containing monomer, and
   the fluorine-containing monomer is represented by one of the following Formulae 1 to 18:

<Formula 1>
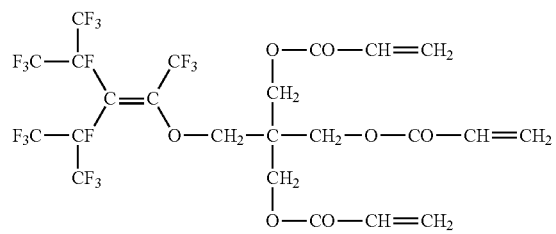
<Formula 2>
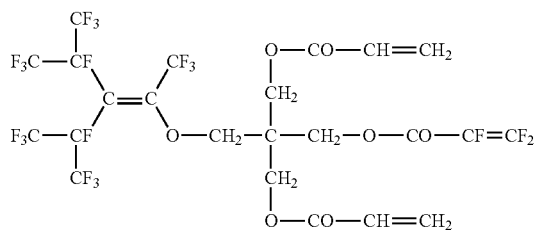
<Formula 3>
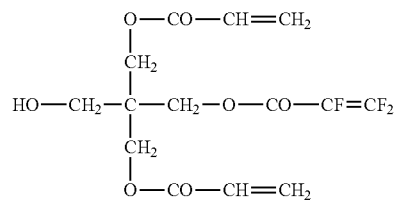
<Formula 4>
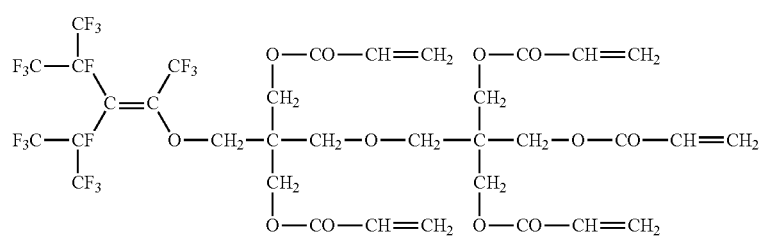
<Formula 5>
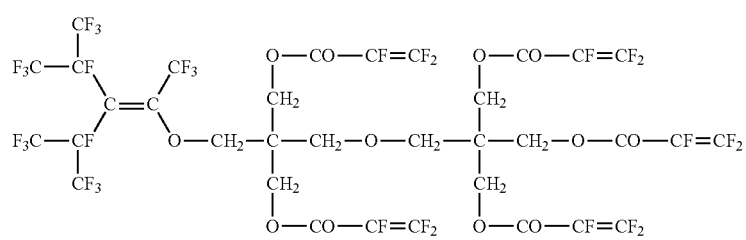
<Formula 6>
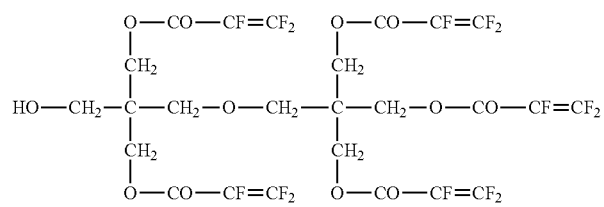
<Formula 7>
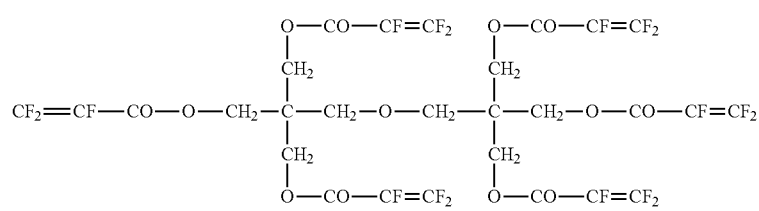
<Formula 8>
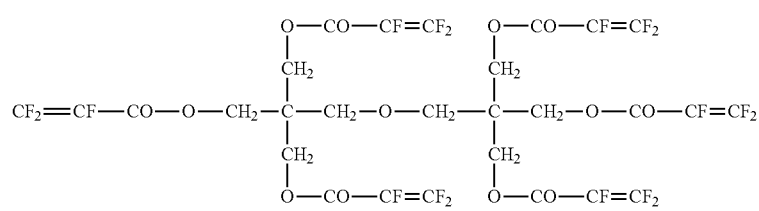
<Formula 9>
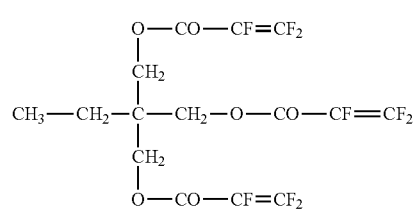
<Formula 10>
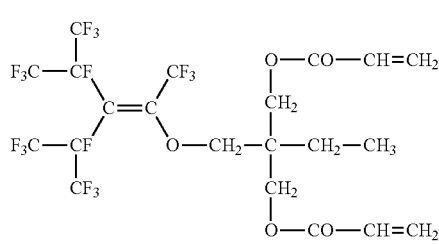

-continued

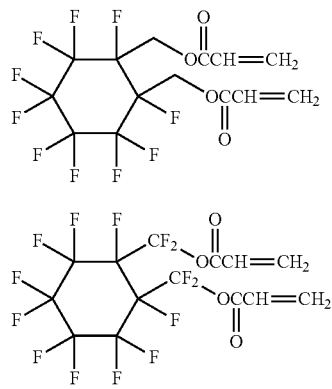
<Formula 11>

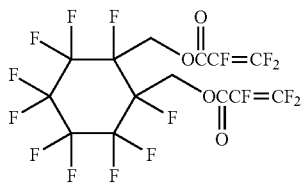
<Formula 12>

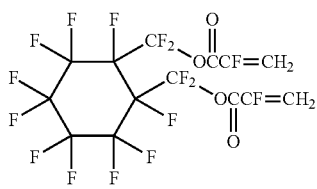
<Formula 14>

<Formula 13>

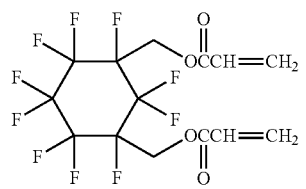
<Formula 15>

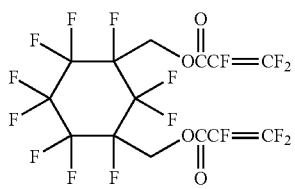
<Formula 16>

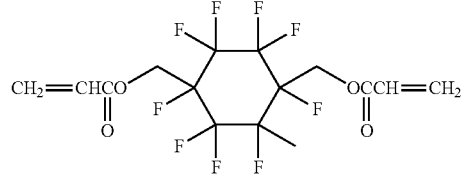
<Formula 17>

<Formula 18>

20. The method as claimed in claim 14, wherein:
the matrix composition includes the fluorine-containing monomer, and
the fluorine-containing monomer is represented by one of the following Formulae 1 to 18:

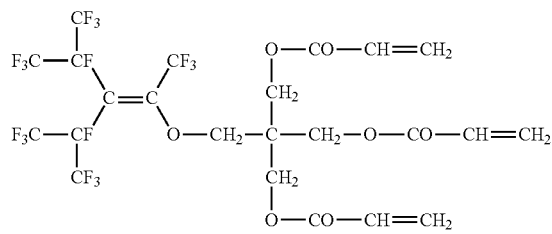
<Formula 1>

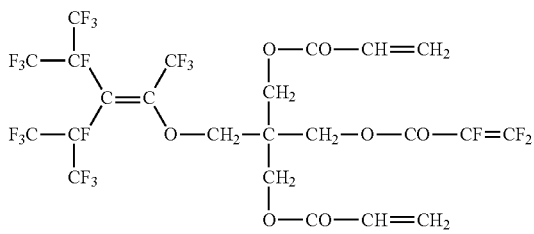
<Formula 2>

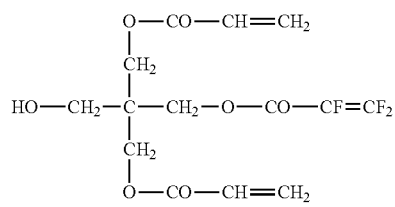
<Formula 3>

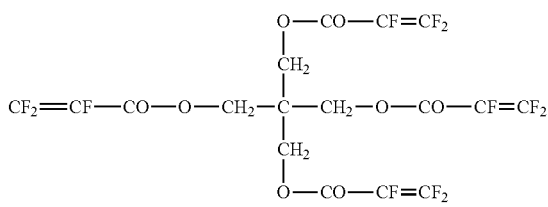
<Formula 4>

-continued
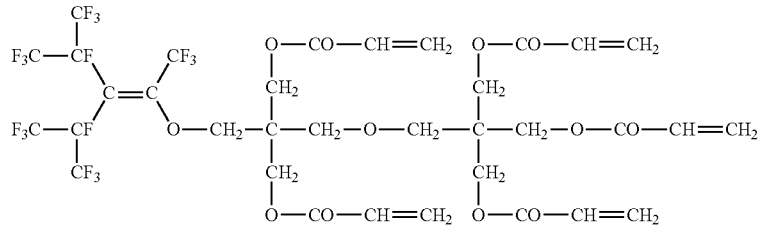
<Formula 5>
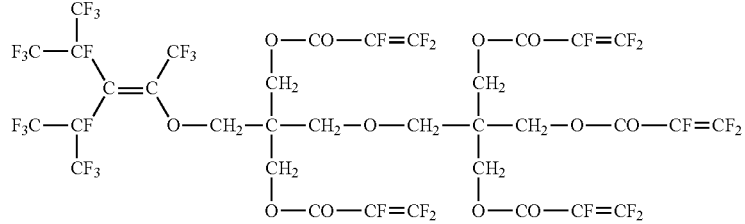
<Formula 6>
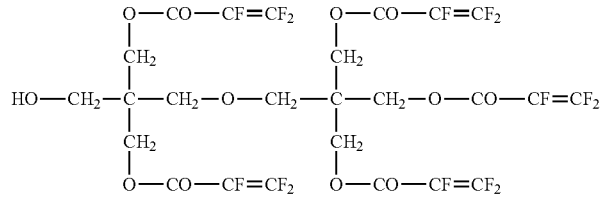
<Formula 7>
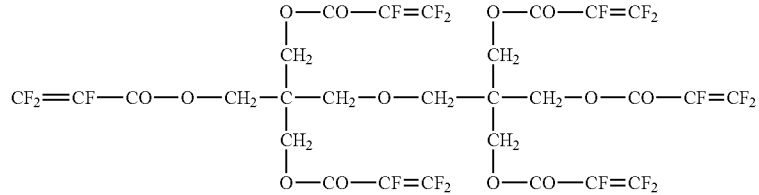
<Formula 8>
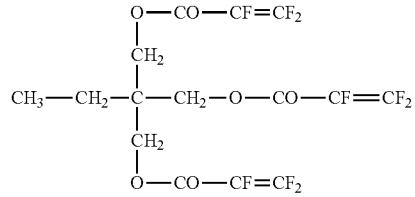
<Formula 9>
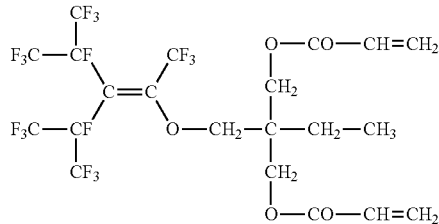
<Formula 10>
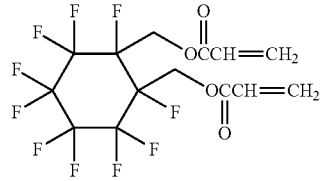
<Formula 11>
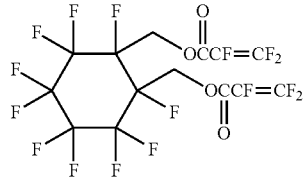
<Formula 12>
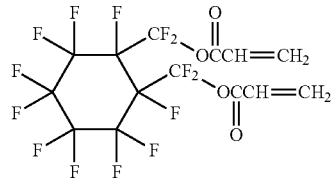
<Formula 13>
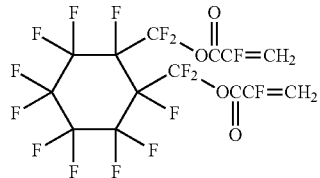
<Formula 14>

-continued
<Formula 15>
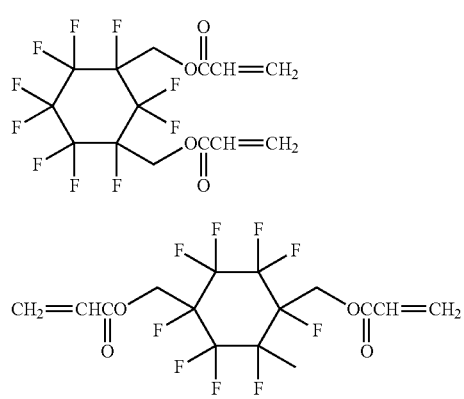
<Formula 16>
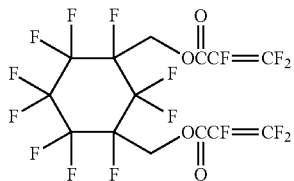
<Formula 17>
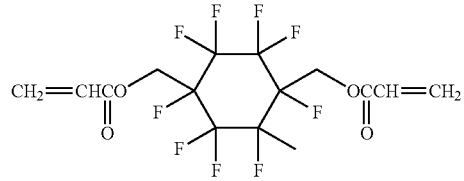
<Formula 18>
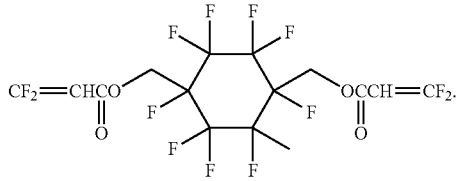
* * * * *